United States Patent
Chen et al.

(10) Patent No.: US 11,557,687 B2
(45) Date of Patent: Jan. 17, 2023

(54) SOLAR CELL DEVICE AND OPTICAL COMPOSITE FILM ASSEMBLY

(71) Applicant: Southern Taiwan University of Science and Technology, Tainan (TW)

(72) Inventors: Ruei-Tang Chen, Tainan (TW); Fong-Lang Wu, Kouhu Township, Yunlin County (TW)

(73) Assignee: SOUTHERN TAIWAN UNIVERSITY OF SCIENCE AND TECHNOLOGY, Tainan (TW)

( * ) Notice: Subject to any disclaimer, the term of this patent is extended or adjusted under 35 U.S.C. 154(b) by 129 days.

(21) Appl. No.: 16/934,540

(22) Filed: Jul. 21, 2020

(65) Prior Publication Data
US 2021/0288199 A1 Sep. 16, 2021

(30) Foreign Application Priority Data
Mar. 11, 2020 (TW) ................................ 109108031

(51) Int. Cl.
*H01L 31/054* (2014.01)
*G02B 5/02* (2006.01)
*H01L 31/048* (2014.01)

(52) U.S. Cl.
CPC .......... *H01L 31/054* (2014.12); *G02B 5/0242* (2013.01); *G02B 5/0278* (2013.01); *H01L 31/048* (2013.01)

(58) Field of Classification Search
CPC ... H01L 31/048; H01L 31/054; H01L 31/055; G02B 5/0242; G02B 5/0278; H02S 40/20; Y02E 10/52
See application file for complete search history.

(56) References Cited

U.S. PATENT DOCUMENTS

| | | | |
|---|---|---|---|
| 2014/0332073 A1* | 11/2014 | Chen | H01L 31/0481 136/258 |
| 2017/0139088 A1* | 5/2017 | Iki | G02B 5/0242 |
| 2019/0339432 A1* | 11/2019 | Du | B32B 7/06 |
| 2020/0274013 A1* | 8/2020 | Chen | H01L 31/052 |
| 2021/0159353 A1* | 5/2021 | Li | H01L 31/048 |

* cited by examiner

*Primary Examiner* — Mayla Gonzalez Ramos
(74) *Attorney, Agent, or Firm* — Muncy, Geissler, Old & Lowe, P.C.

(57) ABSTRACT

A solar cell device includes a light-transmissive substrate, a solar cell module, an optical composite film assembly, and a light-transmissive top plate. The solar cell module is disposed on the light-transmissive substrate and includes a solar cell unit. The optical composite film assembly is light-transmissive, and includes a light diffusion layer and a fiber layer. The optical composite film assembly and the solar cell module are disposed on each other. The light-transmissive top plate is disposed spaced apart from the light-transmissive substrate and cooperates with the light-transmissive substrate to sandwich the solar cell module and the optical composite film assembly.

16 Claims, 5 Drawing Sheets

SOLAR CELL DEVICE AND OPTICAL COMPOSITE FILM ASSEMBLY

CROSS-REFERENCE TO RELATED APPLICATION

This application claims priority of Taiwanese Invention Patent Application No. 109108031, filed on Mar. 11, 2020.

FIELD

The disclosure relates to a power generation device, and more particularly to a solar cell device and an optical composite film assembly.

BACKGROUND

In recent years, for the purpose of generating electrical power in a safe and environmentally friendly manner, many countries have continued to develop renewable energy (i.e., "green energy") industry by utilizing technologies such as wind power, hydropower, and solar power.

In the utilization of solar power, a solar cell device (such as solar panels) is installed on a vast land (such as farm lands) or a light-receiving area of a building so that sunlight absorbed by the solar panels can be converted into electrical energy.

Since the solar panels are usually installed outdoors for improving light absorption, the solar panels might suffer damages from strong winds (e.g. in a typhoon season). In addition, the solar panels might occupy large areas of the farm lands, which may cause an adverse impact on agricultural production. Therefore, there is still a need to enhance the mechanical strength and improve utilization efficiency of the solar panels.

SUMMARY

Therefore, an object of the disclosure is to provide a solar cell device that can alleviate at least one of the drawbacks of the prior art.

According to the disclosure, the solar cell device includes a light-transmissive substrate, a solar cell module, an optical composite film assembly, and a light-transmissive top plate.

The solar cell module is disposed on the light-transmissive substrate and includes a solar cell unit. The optical composite film assembly is light-transmissive, and includes a light diffusion layer and a fiber layer disposed in the light diffusion layer. The optical composite film assembly and the solar cell module are disposed on each other.

The light-transmissive top plate is disposed spaced apart from the light-transmissive substrate and cooperates with the light-transmissive substrate to sandwich the solar cell module and the optical composite film assembly.

Another object of the disclosure is to provide an optical composite film assembly that can alleviate at least one of the drawbacks of the prior art.

According to the disclosure, the optical composite film assembly is adapted for use in the solar cell device as mentioned above, and includes a light diffusion layer and a fiber layer disposed in the light diffusion layer.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
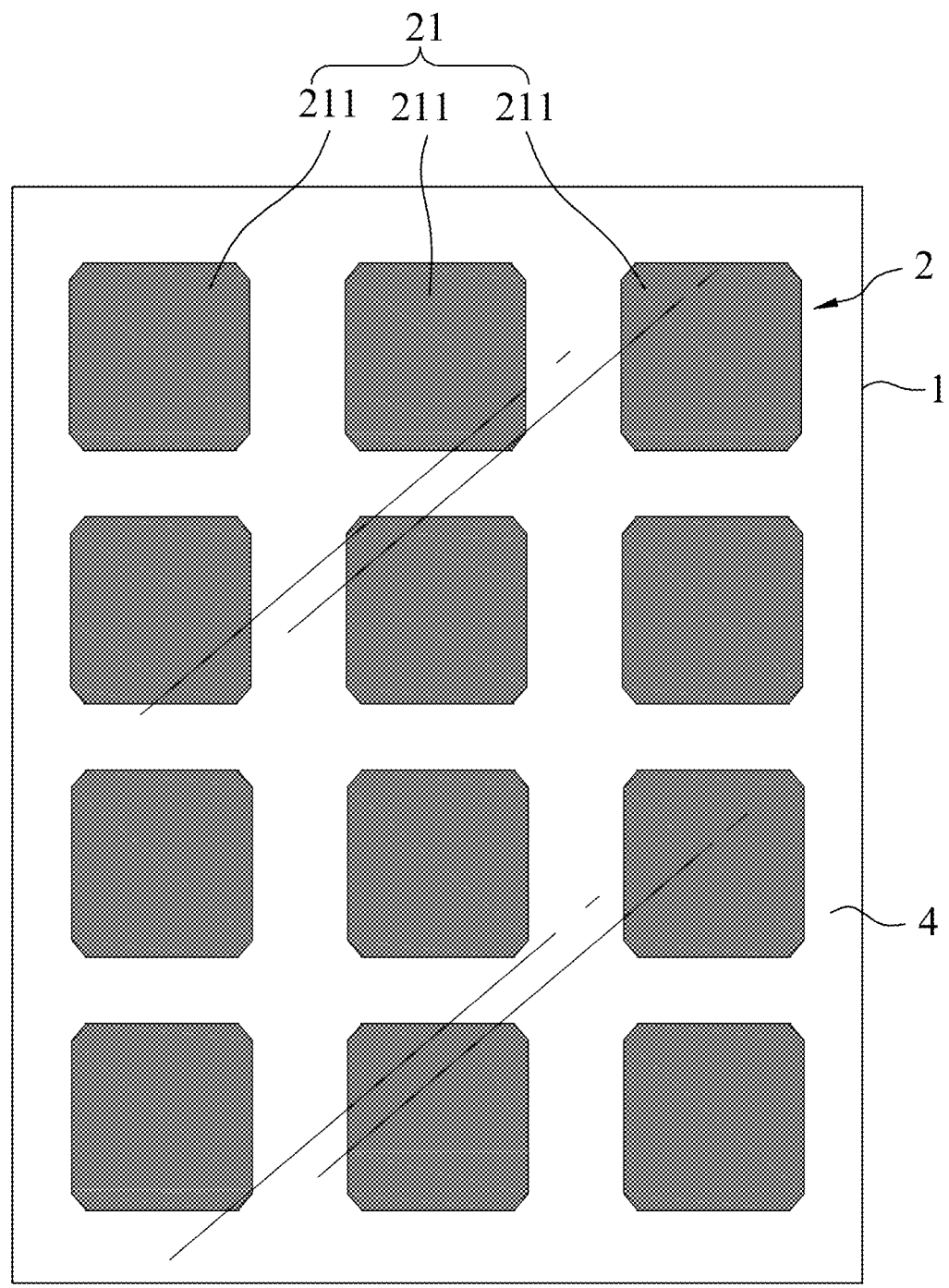
FIG. 1 is a schematic top view illustrating a first embodiment of a solar cell device according to the disclosure.

Before the disclosure is described in greater detail, it should be noted that where considered appropriate, reference numerals or terminal portions of reference numerals have been repeated among the FIGS. to indicate corresponding or analogous elements, which may optionally have similar characteristics.

Figure 2:
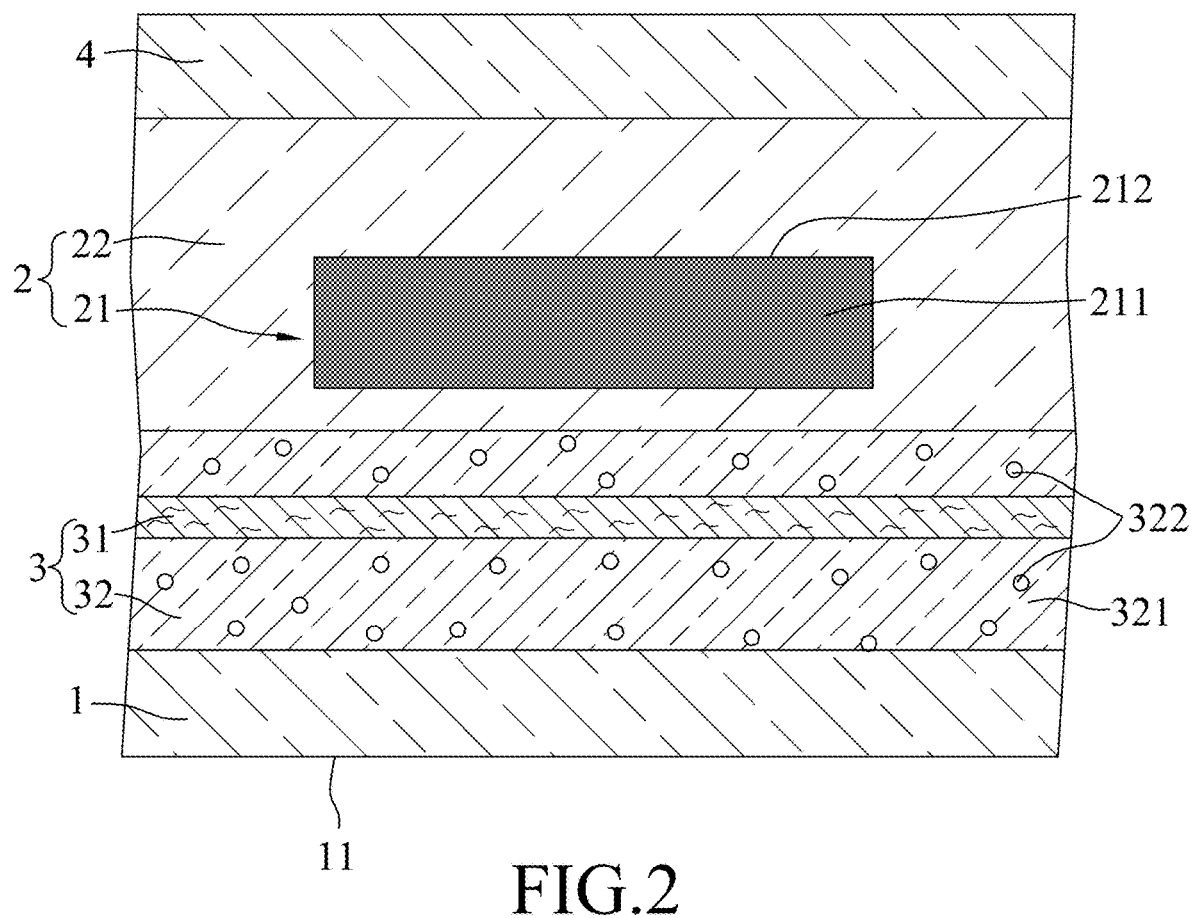
FIG. 2 is a partially sectional view illustrating the first embodiment.

Referring to FIGS. 1 to 2, a first embodiment of the solar cell device according to the present disclosure includes alight-transmissive substrate 1, a solar cell module 2, an optical composite film assembly 3, and a light-transmissive top plate 4.

The light-transmissive substrate 1 may be a light-transmissive back-sheet. Alternatively, in certain embodiments, the light-transmissive substrate 1 may be a light-transmissive plastic sheet or film.

The optical composite film assembly 3 is light-transmissive. The optical composite film assembly 3 includes a light diffusion layer 32 which is disposed above the light-transmissive substrate 1, and a fiber layer 31 disposed in the light diffusion layer 32 to increase the mechanical strength of the optical composite film assembly 3, such that the solar cell device may not be easily damaged after long exposures to wind and sun.

The fiber layer 31 may be made of at least one fiber material selected from the group consisting of glass, aramid (e.g. Kelvar), polyethylene terephthalate (e.g. Dacron), polyester, and polyamide (e.g. Nylon). In this embodiment, the fiber layer 31 is made of glass (i.e., glass fabric).

The light diffusion layer 32 may include a light-transmissive binder material 321 which connects to the light-transmissive substrate 1 and which covers the fiber layer 31, and a plurality of particles dispersed in the light-transmissive binder material 321.

There are no particular limitations on the light-transmissive binder material 321, as long as the particles are allowed to be dispersed therein, and is curable to enable the fiber layer 31 to be securely disposed above the light-transmissive substrate 1. For example, the light-transmissive binder material 321 may be a thermoplastic resin. In this embodiment, the light-transmissive binder material 321 is mainly made of ethylene-vinyl acetate copolymer (EVA).

In this embodiment, the dispersed particles are scattering particles 322 for scattering light incident thereon in various directions. The scattering particles 322 may be made of metal oxide. Each of the scattering particles 322 may have a diameter ranging from 10 nm to 2000 nm.

The solar cell module 2 is disposed on and spaced apart from the light-transmissive substrate 1. The optical composite film assembly 3 and the solar cell module 2 are disposed on each other. In this embodiment, the optical composite film assembly 3 and the solar cell module 2 are sequentially disposed on the light-transmissive substrate 1 in such order.

That is, the optical composite film assembly 3 is interposed between the light-transmissive substrate 1 and the solar cell module 2.

The solar cell module 2 includes a solar cell unit 21, and a light-transmissive binder layer 22 which covers the solar cell unit 21.

The solar cell unit 21 may include a plurality of spaced-apart solar cells 211 which are disposed above the optical composite film assembly 3 and which are arranged in an array.

The light-transmissive binder layer 22, which may be a thermoplastic resin, is positioned between the light diffusion layer 32 and the light-transmissive top plate 4, and covers the solar cells 211 of the solar cell unit 21, so as to allow the solar cells 211 to be securely disposed between the optical composite film assembly 3 and the light-transmissive top plate 4.

Each of the solar cells 211 has a light receiving surface 212 opposite to the light-transmissive substrate 1, and is a silicon semiconductor solar cell 211. The silicon semiconductor solar cell 211 may be made of monocrystalline silicon, polycrystalline silicon or amorphous silicon. The solar cell 211 made of monocrystalline silicon provides an improved light conversion efficiency than that of the solar cell 211 made of polycrystalline silicon or amorphous silicon.

There are no particular limitations on the material for making the light-transmissive binder layer 22 as long as such material is curable to cover the solar cells 211 and enable the solar cells 211 to be securely disposed therein. In this embodiment, the light-transmissive binder layer 22 is made of the same material as the light-transmissive binder material 321 (i.e., mainly made of EVA).

The light-transmissive top plate 4 is disposed spaced apart from the light-transmissive substrate 1 and cooperates with the light-transmissive substrate 1 to sandwich the solar cell module 2 and the optical composite film assembly 3. In other words, the light-transmissive top plate 4 is on top of the solar cell device. In this embodiment, the light-transmissive top plate 4 is a transparent tempered glass plate.

In use, a portion of light may pass through the light-transmissive top plate 4 to enter the solar cells 211 from the light receiving surface 212 for photoelectric conversion. The remainder of the light may sequentially pass through the light-transmissive top plate 4, a gap between the solar cells 211 on the light-transmissive binder layer 22 (without entering the solar cells 211 for photoelectric conversion), the optical composite film assembly 3 and the light-transmissive substrate 1 to be emitted outside the solar cell device from a light exit surface 11 of the light-transmissive substrate 1 opposite to the light-transmissive top plate 4. In other words, when the solar cell device of this disclosure is disposed on an open area (e.g., a farm land), a light passing through the light diffusion layer 32 of the optical composite film assembly 3 can be scattered by the scattering particles 322 dispersed therein to modify the traveling direction thereof, and then evenly exits from the light exit surface 11 of the light-transmissive substrate 1. Therefore, the growth of crops underneath the solar cell device may not be affected.

A method for manufacturing the first embodiment of the solar cell device is described as follows.

To be specific, an EVA sheet is placed on the light-transmissive top plate 4, followed by placing the solar cells 211 on the EVA sheet in an array arrangement. Next, two EVA diffusion plates including the scattering particles 322 distributed therein are placed on the solar cells 211, and the fiber layer 31 is sandwiched between the EVA diffusion plates. After that, the light-transmissive substrate 1 is stacked on one of the EVA diffusion plates opposite to the light-transmissive top plate 4, so as to form a semi-finished product. Finally, the semi-finished product is subjected to a hot press process in an oven so as to cure the EVA sheet to form the light-transmissive binder layer 22 and to cure the EVA diffusion plates to form the light diffusion layer 32, thereby obtaining the first embodiment of the solar cell device. It should be noted that for reducing the bubbles formed in the light-transmissive binder layer 22 and the light diffusion layer 32, a vacuum pump may be used to evacuate air from the oven during the hot press process.

A fixed frame (such as aluminum frame) may be assembled to surround the solar cell device of this disclosure, so as to facilitate mounting of the solar cell device on a desired location (such as a building) for absorbing sunlight.

Figure 3:
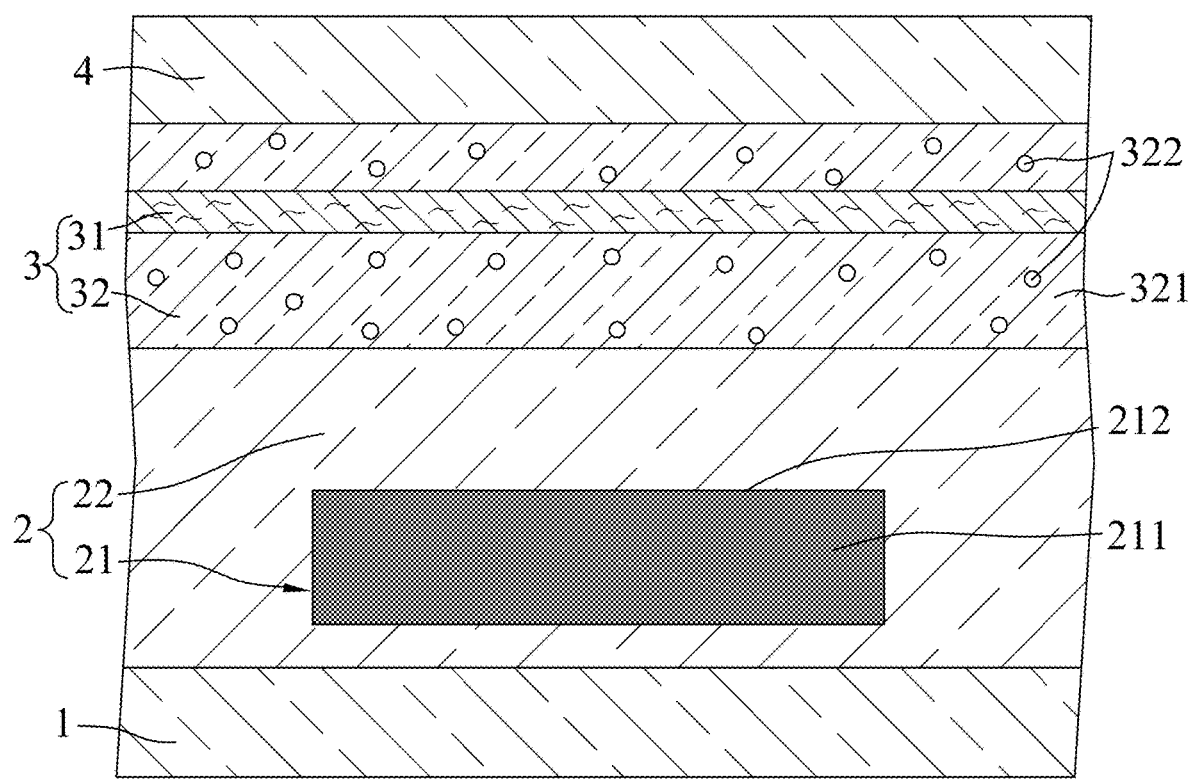
FIG. 3 is a partially sectional view illustrating a second embodiment of the solar cell device according to the disclosure.

Referring to FIG. 3, a second embodiment of the solar cell device according to the disclosure is generally similar to the first embodiment, except that in the second embodiment, the optical composite film assembly 3 and the solar cell module 2 are sequentially disposed on the light-transmissive substrate 1 in such order. That is, the solar cell module 2 is interposed between the light-transmissive substrate 1 and the optical composite film assembly 3.

Figure 4:
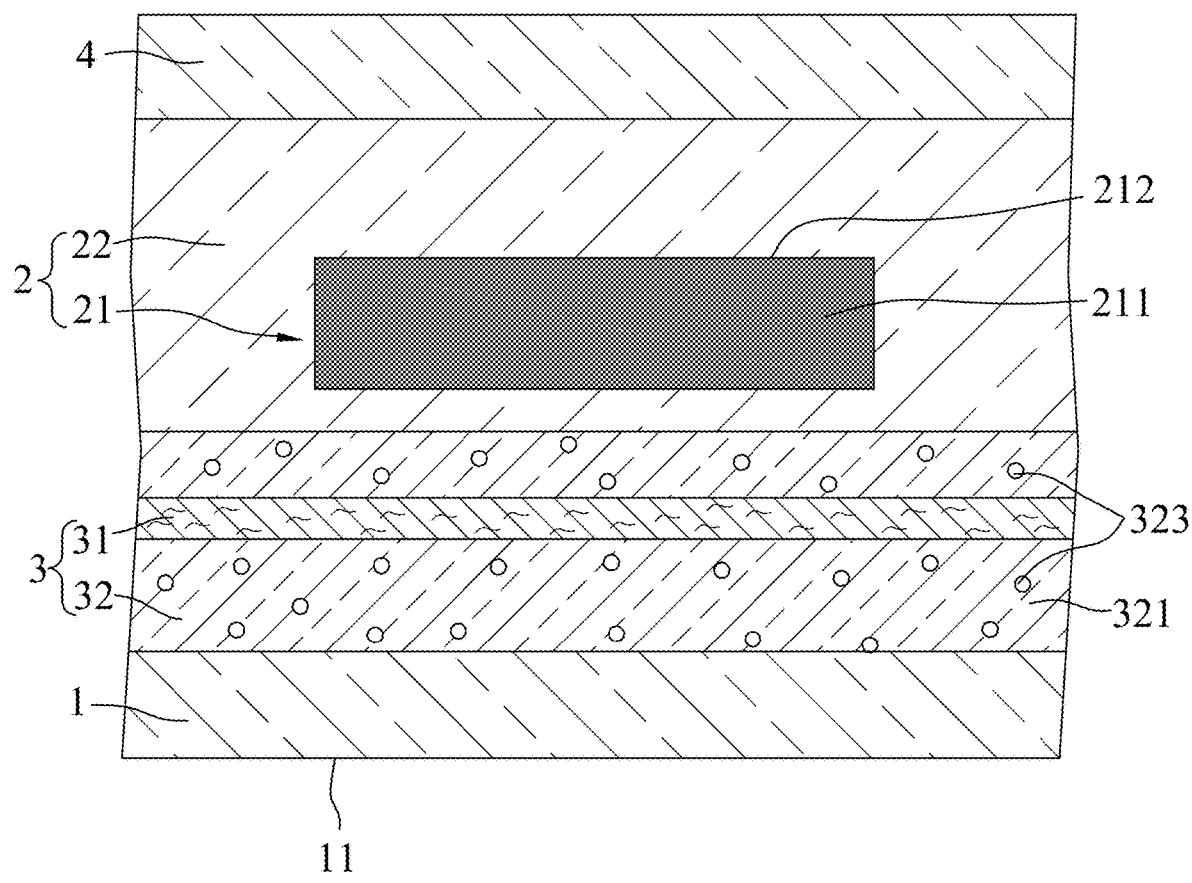
FIG. 4 is a partially sectional view illustrating a variation of the first embodiment.
Figure 5:
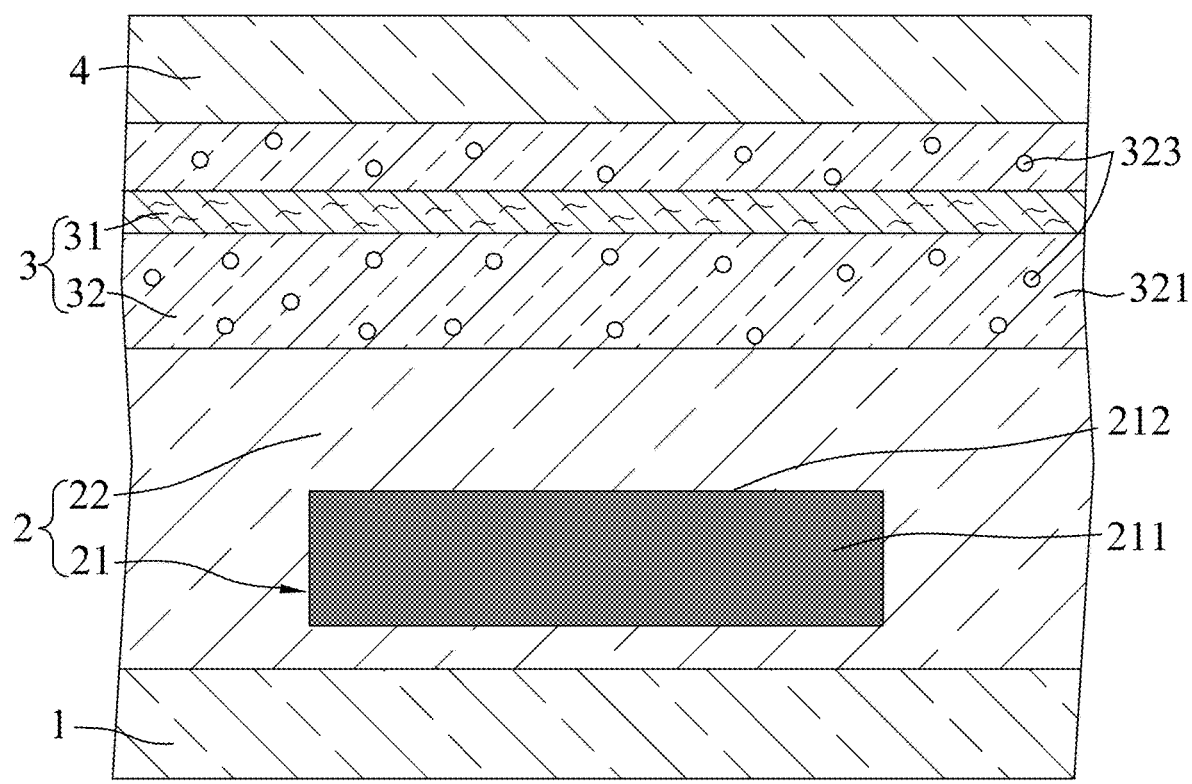
FIG. 5 is a partially sectional view illustrating a variation of the second embodiment.

It should be noted that the scattering particles 322 dispersed in the light transmissive binder material 321 may be replaced by a plurality of fluorescent particles 323 in variations of the first and second embodiments (see FIGS. 4 and 5).

An experimental sample of the solar cell device having the configuration of the second embodiment as described above and a comparative sample of the solar cell device were prepared and subjected to a test as follows.

Preparation of the Solar Cell Device

Specifically, the experimental sample includes the light-transmissive substrate 1 having a size of 967 mm (length)× 652 mm (width)×1 mm (thickness), the solar cell module 2 formed on the light-transmissive substrate 1, the optical composite film assembly 3 formed on the solar cell module 2, and a tempered glass plate with a thickness of 3.2 mm (serving as the light-transmissive top plate 4) covering the optical composite film assembly 3.

The solar cell module 2 includes the light-transmissive binder layer 22 made of EVA with a thickness ranging from 0.1 mm to 1 mm, and an array of the solar cells 211 (purchased from KOOTATU Tech Corp) covered by the light-transmissive binder layer 22. The spacing between two adjacent ones of the solar cells 211 ranges from 50 mm to 120 mm. The optical composite film assembly 3 includes the fiber layer 31 made of glass fabric (purchased from TAI-WANGLASS), and the light diffusion layer 32 covering the fiber layer 31. The light diffusion layer 32 includes the light-transmissive binder material 321 made of EVA with a thickness ranging from 0.3 mm to 12 mm, and the scattering particles 322 which are dispersed in the light-transmissive binder material 321 in a concentration of 400 ppm.

The comparative sample is generally similar to the experimental sample, except that the comparative sample does not include the optical composite film assembly 3.

Test Method

The same amount of spinach seeds was sowed in two pots with the same weight of soils. The comparative sample and the experimental sample were placed at a height of 500 mm above the pots, respectively. After exposure to the sunlight for 13 days, the spinach grown in each of the two pots was harvested, and then baked in an oven at 100° C. for 2 hours to remove water content thereof. The weight of the dried spinach was measured, and the result is shown in Table 1.

TABLE 1

| Solar cell device | Baking time (hr) | Baking temperature (° C.) | Weight of spinach (g) |
| --- | --- | --- | --- |
| Experimental sample | 2 | 100 | 34 |
| Comparative sample | 2 | 100 | 21 |

Referring to Table 1, the weight of the spinach grown underneath the experimental sample is about 1.5 times greater than the weight of the spinach grown underneath the comparative sample. The test result shows that by virtue of the light diffusion layer 31 of the optical composite film assembly 3, the solar cell device of this disclosure installed on a farm land can convert light into electrical power and can simultaneously maintain the growth of crops, so as to increase land-use efficiency.

In summary, with the fiber layer 31 of the optical composite film assembly 3, the solar cell device of the disclosure may have enhanced mechanical strength to avoid being damaged by strong wind. Furthermore, since the optical composite film assembly 3, the substrate 1 and the top plate 4 are light-transmissive, the crops positioned underneath the solar cell device still can absorb sunlight which passes through the solar cell device for photosynthesis, without disturbing the growth of the crops. Therefore, the solar cell device of the disclosure, when installed on a farm land, not only enables the crops to grow but also simultaneously converts light into electrical power, thereby increasing the land-use efficiency and output value.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, FIG., or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A solar cell device, comprising:
a light-transmissive substrate;
a solar cell module which is disposed on said light-transmissive substrate and which includes a solar cell unit;
an optical composite film assembly which is light-transmissive, and which includes a light diffusion layer and a fiber layer disposed in said light diffusion layer, said optical composite film assembly and said solar cell module being disposed on each other; and
a light-transmissive top plate which is disposed spaced apart from said light-transmissive substrate and which cooperates with said light-transmissive substrate to sandwich said solar cell module and said optical composite film assembly.

2. The solar cell device of claim 1, wherein said solar cell module further includes a light-transmissive binder layer which covers said solar cell unit.

3. The solar cell device of claim 2, wherein said solar cell module and said optical composite film assembly are sequentially disposed on said light-transmissive substrate in such order.

4. The solar cell device of claim 2, wherein said optical composite film assembly and said solar cell module are sequentially disposed on said light-transmissive substrate in such order.

5. The solar cell device of claim 1, wherein said light diffusion layer of said optical composite film assembly includes a light-transmissive binder material, and a plurality of particles which are dispersed in said light transmissive binder material, said particles being selected from the group consisting of scattering particles, fluorescent particles, and a combination thereof.

6. The solar cell device of claim 5, wherein said particles are scattering particles made of metal oxide, each of which has a diameter ranging from 20 nm to 1800 nm.

7. The solar cell device of claim 5, wherein said particles are fluorescent particles.

8. The solar cell device of claim 1, wherein said solar cell unit of said solar cell module includes a plurality of spaced-apart solar cells that are arranged in an array.

9. The solar cell device of claim 1, wherein said fiber layer is made of at least one fiber material selected from the group consisting of glass, aramid, polyethylene terephthalate, polyester, and polyamide.

10. An optical composite film assembly adapted for use in a solar cell device, the solar cell device including a light-transmissive substrate, a solar cell module disposed on the light-transmissive substrate and a top plate disposed on the solar cell module opposite to the light-transmissive substrate, said optical composite film assembly being adapted to be interposed between the light-transmissive substrate and the top plate, said optical composite film assembly and the solar cell module being disposed on each other, said optical composite film assembly comprising a light diffusion layer and a fiber layer disposed in said light diffusion layer.

11. The optical composite film assembly of claim 10, wherein said light diffusion layer includes a light transmissive binder material, and a plurality of particles which are dispersed in said light transmissive binder material, said particles being selected from the group consisting of scattering particles, fluorescent particles, and a combination thereof.

12. The optical composite film assembly of claim 11, wherein said particles are scattering particles made of metal oxide, each of which has a diameter ranging from 20 nm to 1800 nm.

13. The optical composite film assembly of claim 11, wherein said particles are fluorescent particles.

14. The optical composite film assembly of claim 10, wherein said fiber layer is made of at least one fiber material selected from the group consisting of glass, aramid, polyethylene terephthalate, polyester, and polyamide.

15. The solar cell device of claim 1, wherein said fiber layer is disposed in said light diffusion layer such that said light diffusion layer is divided into first and second parts, and said fiber layer is disposed between said first and second parts.

16. The optical composite film assembly of claim 10, wherein said fiber layer is disposed in said light diffusion layer such that said light diffusion layer is divided into first and second parts, and said fiber layer is disposed between said first and second parts.

* * * * *